(12) United States Patent
He

(10) Patent No.: US 11,817,539 B1
(45) Date of Patent: Nov. 14, 2023

(54) IN-LINE TYPE POINT CONTROL LAMP AND LAMP STRING STRUCTURE

(71) Applicant: SHANGYOU JIAYI LIGHTING PRODUCT CO., LTD., Ganzhou (CN)

(72) Inventor: Yaowen He, Ganzhou (CN)

(73) Assignee: Shangyou Jiayi Lighting Product Co., Ltd., Ganzhou (CN)

( * ) Notice: Subject to any disclaimer, the term of this patent is extended or adjusted under 35 U.S.C. 154(b) by 0 days.

(21) Appl. No.: 18/059,802

(22) Filed: Nov. 29, 2022

(30) Foreign Application Priority Data

Jun. 1, 2022 (CN) .......................... 202221358681.5

(51) Int. Cl.
*H01L 33/62* (2010.01)
*H01L 25/075* (2006.01)
(52) U.S. Cl.
CPC .......... *H01L 33/62* (2013.01); *H01L 25/0753* (2013.01)

(58) Field of Classification Search
CPC combination set(s) only.
See application file for complete search history.

(56) References Cited

U.S. PATENT DOCUMENTS

| 11,239,393 B1 * | 2/2022 | Huang | .................... H05K 1/111 |
| 2008/0274377 A1 * | 11/2008 | Lin | .......................... C04B 26/02 |
| | | | 427/58 |

FOREIGN PATENT DOCUMENTS

WO  WO-2020191826 A1 * 10/2020

* cited by examiner

*Primary Examiner* — Ratisha Mehta
(74) *Attorney, Agent, or Firm* — Hogan Lovells US LLP

(57) ABSTRACT

The present disclosure provides an in-line type point control lamp and a lamp string structure, which relate to the technical field of point control lamps, and include: a patch lamp bead and an in-line LED bracket; by providing two power lines and one signal line on the patch lamp bead, the separately provided signal line is used to transmit the signal, and the power line and the signal line are fixed on the power connecting part and the signal connecting part respectively.

6 Claims, 2 Drawing Sheets

IN-LINE TYPE POINT CONTROL LAMP AND LAMP STRING STRUCTURE

CROSS-REFERENCE TO RELATED APPLICATION

The present disclosure claims priority of Chinese patent application with the filing number 2022213586815 filed on Jun. 1, 2022, the contents of which are incorporated herein by reference in entirety.

TECHNICAL FIELD

The present disclosure relates to the technical field of point control lamps, in particular to an in-line type point control lamp and a lamp string structure.

BACKGROUND ART

The existing neon point control lamps are mainly based on LED patch lamp beads, while the traditional in-line LED lamps are 2-wire carrier point control, which transmit signals through the power lines.

However, since the signals are transmitted through the power lines, the stability of the signals transmitted by the power lines will be affected by the power supply, resulting in that the maximum number of lamps having stable signal is currently less, and more lamps cannot be stabilized.

SUMMARY

The purpose of the present disclosure is to provide an in-line type point control lamp and a lamp string structure, which solves the technical problem that the traditional point control lamps existed in the prior art transmit signals through power lines, and the stability of the signals transmitted by the power lines will be affected by the power supply, resulting in that the maximum number of lamps having stable signal is currently less, and more lamps cannot be stabilized.

In the first aspect, the in-line type point control lamp provided by the present disclosure, which comprises: a patch lamp bead and an in-line LED bracket; and the patch lamp bead has two power lines and one signal line, and the in-line LED bracket has two power connecting parts and one signal connecting part, the two power lines are respectively connected to the two power connecting parts, and the signal line is connected to the signal connecting part.

In an optional embodiment, the patch lamp bead has a welding plate surface, and the two power connecting parts and the one signal connecting part are all welded on the welding plate surface.

In an optional embodiment,
the in-line LED bracket comprises three welding parts; and
the three welding parts are arranged side by side in parallel, and the three welding parts are all welded on the welding plate surface.

In an optional embodiment,
any two of the three welding parts are the power connecting parts, and one of the three welding parts is the signal connecting part.

In an optional embodiment,
the two power lines are respectively located on two sides of the signal line; and the welding parts located on two sides are the two power connecting parts and the welding part located in a middle of the two welding parts is the signal connecting part.

In an optional embodiment,
the in-line type point control lamp further comprises an injection molded part; and
the patch lamp bead is provided in the injection molded part, and the power connecting parts extend into the injection molded part and are connected to the power lines, and the signal connecting part passes through the injection molded part and is connected to the signal line.

In an optional embodiment,
the welding plate surface has three bonding pads, and the two power connecting parts and the one signal connecting part are respectively welded on the three bonding pads.

In an optional embodiment,
the three bonding pads are respectively electrically connected to the two power lines and one signal line.

In an optional embodiment,
the welding plate surface is located on a backside of the patch lamp bead.

In the second aspect, a lamp string structure provided by the present disclosure comprises the in-line type point control lamp.

The in-line type point control lamp provided by the present disclosure comprises: a patch lamp bead and an in-line LED bracket; the patch lamp bead has two power lines and one signal line, and the in-line LED bracket has two power connecting parts and the one signal connecting part, the two power lines are respectively connected to the two power connecting parts, and the signal line is connected to the signal connecting part. By providing two power lines and one signal line on the patch lamp bead, the separately provided signal line is used to transmit the signal, and the power line and the signal line are fixed on the power connecting part and the signal connecting part respectively, compared with the traditional power line transmitting signal, a separate signal line used to transmit the signal can effectively improve the stability and yield of the lamp bead, and solve the technical problem that the traditional point control lamps existed in the prior art transmit signals through power lines, and the stability of the signals transmitted by the power lines will be affected by the power supply, resulting in that the maximum number of lamps having stable signal is currently less, and more lamps cannot be stabilized.

BRIEF DESCRIPTION OF DRAWINGS

In order to illustrate the specific embodiments of the present disclosure or technical solutions in the prior art more clearly, the drawings need to be used in the description of the specific embodiments or the prior art will be briefly introduced below, obviously, the drawings in the following description are some embodiments of the present disclosure, and for those ordinarily skilled in the art, other drawings can also be obtained in light of these drawings, without using any inventive efforts.

Figure 1:
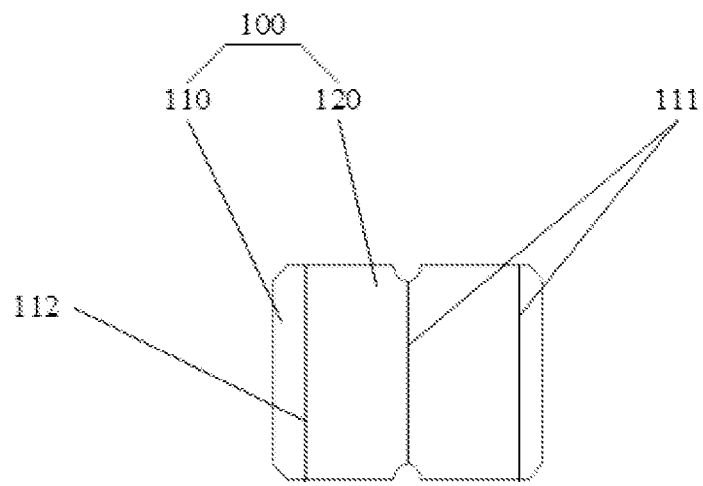
FIG. 1 is a structural schematic view of a patch lamp bead in an in-line type point control lamp provided by an embodiment of the present disclosure.

Reference numerals: 100—patch lamp bead; 110—welding plate surface; 111—power line; 112—signal line; 120—bonding pad; 200—in-line LED bracket; 210—power connecting part; 220—signal connecting part; 300—injection molded part.

DETAILED DESCRIPTION OF EMBODIMENTS

In order to make the purposes, technical solutions and advantages of the embodiments of the present disclosure clearer, the technical solutions in the embodiments of the present disclosure will be clearly and completely described below in combination with the drawings in the embodiments of the present disclosure, and obviously, the embodiments described are part of the embodiments of the present disclosure, rather than all embodiments. The components of the embodiments of the present disclosure, which are generally described and shown in the drawing herein, may be arranged and designed in a variety of different configurations.

Therefore, the following detailed description of the embodiments of the present disclosure provided in the drawings is not intended to limit the claimed scope of the present disclosure, but merely represents selected embodiments of the present disclosure. Based on the embodiments in the present disclosure, all other embodiments obtained by those ordinarily skilled in the art, without making inventive effort, fall within the protection scope of the present disclosure.

It should be noted that similar reference numerals and letters indicate similar items in the following drawings, therefore, once a certain item is defined in one drawing, it does not need to be further defined and explained in the subsequent drawings.

In the description of the present disclosure, it should be noted that the orientation or positional relationship indicated by the terms "center", "upper", "lower", "left", "right", "vertical", "horizontal", "inner" and "outer" etc. are based on the orientation or positional relations as shown in the drawings, or it is the orientation or positional relationship that the product of the invention is usually placed in use, merely for facilitating the description of the present disclosure and simplifying the description, rather than indicating or implying that related devices or elements have to be in the specific orientation, or configured or operated in a specific orientation, therefore, they should not be construed as limitations on the present disclosure. Besides, terms "first", "second" and "third" etc. are merely for the distinguished description, but should not be construed as indicating or implying importance in relativity.

Furthermore, the terms "horizontal", "vertical", "overhanging" etc. do not imply that a component is required to be absolutely horizontal or overhang, but rather may be slightly inclined. For example, "horizontal" only means that direction thereof is more horizontal than "vertical", it does not mean that the structure must be completely horizontal, but can be slightly inclined.

In the description of the present disclosure, it should be noted that, unless otherwise definitely specified and limited, the terms "arrange" "mount", "link" and "connect" should be understood in a broad sense, for example, they can be fixed connection, detachable connection or integrated connection; they can be mechanical connection or electrical connection; they can be directly attached or indirectly attached by intermediate medium. Connection can be the internal communication between two components. For those ordinarily skilled in the art, the specific meaning of the above terms in the present disclosure can be understood according to the specific situation.

Some embodiments of the present disclosure will be described in detail below with reference to the drawings. In the case of no conflict, the embodiments described below and features in the embodiments can be combined with each other.

Figure 4:
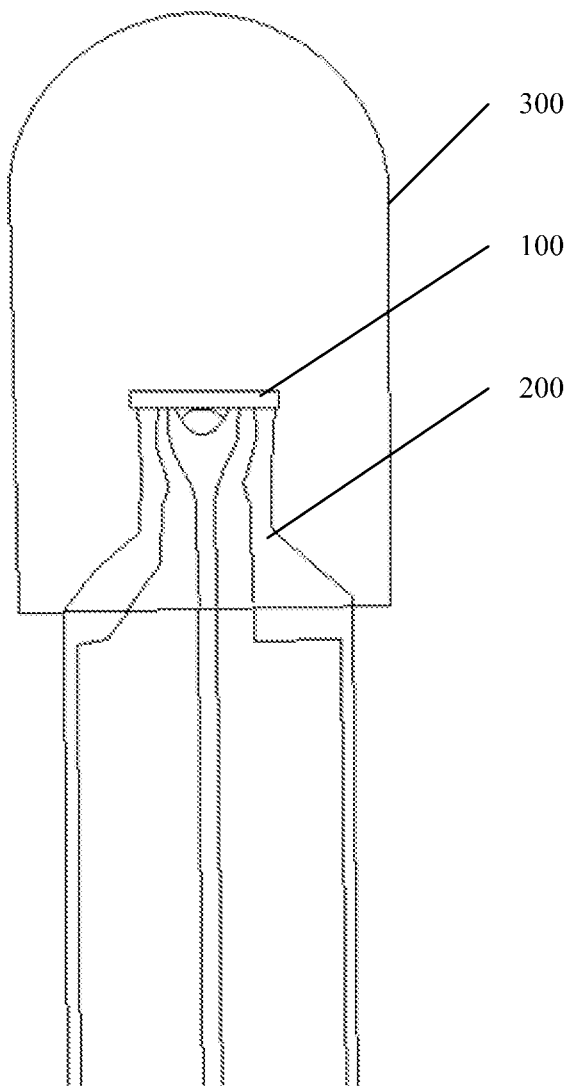
FIG. 4 is a schematic view of an overall structure of the in-line type point control lamp with an injection molded part provided by an embodiment of the present disclosure.

As shown in FIG. 1 and FIG. 4, the in-line type point control lamp provided by the present embodiment comprises a patch lamp bead 100 and an in-line LED bracket 200; the patch lamp bead 100 has two power lines 111 and one signal line 112, and the in-line LED bracket 200 has two power connecting parts 210 and one signal connecting part 220, the two power lines 111 are respectively connected to the two power connecting parts 210, and the signal line 112 is connected to the signal connecting part 220.

Specifically, the patch lamp bead 100 has two power lines 111 and one signal line 112, the two power lines 111 are divided into a positive line and a negative line, two power lines 111 are respectively connected to the two power connecting parts 210 on the in-line LED bracket 200, the power supply is delivered to the two power lines 111 through the power connecting parts 210, the signal line 112 is connected to the signal connecting part 220 on the in-line LED bracket 200, and the signal is transmitted to the signal line 112 through the signal connecting part 220.

In addition, the LED chip and the control IC in the patch lamp bead 100 can also be directly welded on the in-line LED bracket 200 by traditional lamp-making methods such as die bond and wire bond, and then packaged and injection molded outside.

The in-line type point control lamp provided by the present embodiment comprises: a patch lamp bead 100 and an in-line LED bracket 200; the patch lamp bead 100 has two power lines 111 and one signal line 112, and the in-line LED bracket 200 has two power connecting parts 210 and the one signal connecting part 220, the two power lines 111 are respectively connected to the two power connecting parts 210, and the signal line 112 is connected to the signal connecting part 220. By providing two power lines 111 and one signal line 112 on the patch lamp bead 100, the separately provided signal line 112 is used to transmit the signal, and the power line 111 and the signal line 112 are fixed on the power connecting part 210 and the signal connecting part 220 respectively, compared with the traditional power line 111 transmitting signal, a separate signal line 112 used to transmit the signal can effectively improve the stability and yield of the lamp bead, and solve the technical problem that the traditional point control lamps existed in the prior art transmit signals through power lines 111, and the stability of the signals transmitted by the power lines 111 will be affected by the power supply, resulting in that the maximum number of lamps capable of having stable signal is currently less, and more lamps cannot be stabilized.

Figure 2:
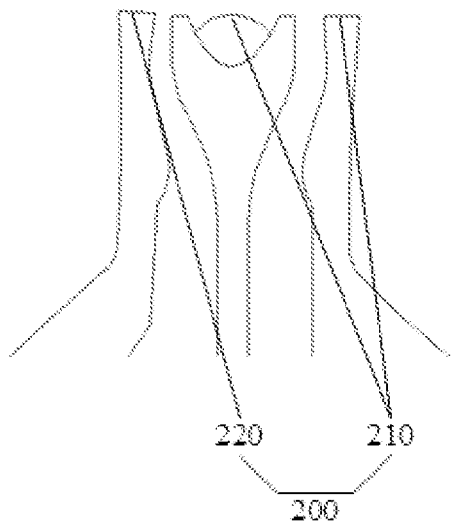
FIG. 2 is a structural schematic view of an end part of an in-line LED bracket in the in-line type point control lamp provided by an embodiment of the present disclosure.
Figure 3:
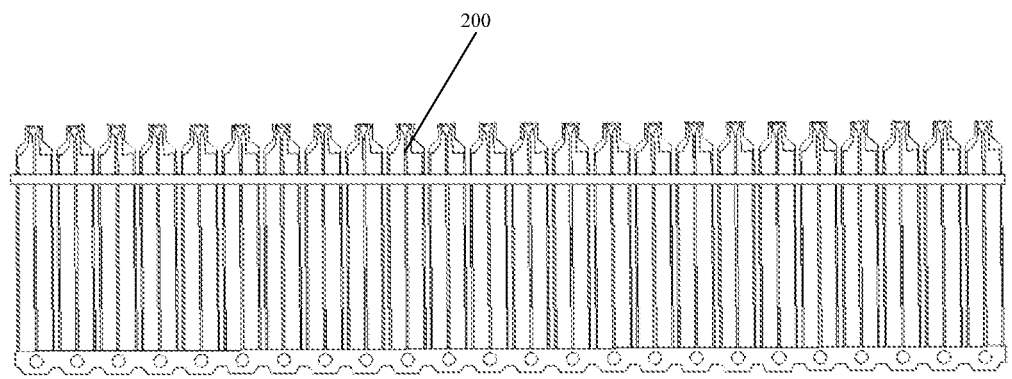
FIG. 3 is a structural schematic view of the in-line LED bracket in the in-line type point control lamp provided by an embodiment of the present disclosure.

On the basis of the above-mentioned embodiments, as shown in FIG. 2 and FIG. 3, in an optional embodiment, the patch lamp bead 100 in the in-line type point control lamp provided by the present embodiment has a welding plate surface 110, and two power connecting parts 210 and the one signal connecting part 220 are all welded on the welding plate surface 110.

Specifically, the welding plate surface 110 is installed on the backside of the patch lamp bead 100, two power lines 111 and one signal line 112 are all electrically connected to the welding plate surface 110, after the power connecting parts 210 and the signal connecting part 220 are welded on the welding plate surface 110, the power lines 111 are connected with the power connecting parts 210, and the signal line 112 is connected with signal connecting part 220.

In an optional embodiment, the in-line LED bracket 200 comprises three welding parts; three welding parts are arranged side by side in parallel, and three welding parts are all welded on the welding plate surface 110; any two of three welding parts are power connecting parts 210, and one of three welding parts is the signal connecting part 220.

Specifically, the in-line LED bracket 200 has three welding parts, and the three welding parts are arranged side by side, wherein any two welding parts can be used as the power connecting parts 210, and the other welding part is the signal connecting part 220. According to the positions of the power lines 111 and the signal line 112 on the patch lamp bead 100, the top of each welding part has a welding point, and the three welding points are divided into positive welding point, negative welding point and signal welding point.

In an optional embodiment, two power lines 111 are respectively located on two sides of the signal line 112; the welding parts located on two sides are two power connecting parts 210, and the welding part located in a middle of the two welding parts is the signal connecting part 220.

Specifically, the two power lines 111 on the patch lamp bead 100 are located on two sides of the signal line 112, respectively, and the signal line 112 is located between the two power lines 111, correspondingly, for the welding parts on the in-line LED bracket 200, the welding parts located on two sides are correspondingly provided as the power connecting parts 210, and the welding part located between the two welding parts is the signal connecting part 220, which corresponds to the patch lamp bead 100.

It should be noted that the specific positions of the signal line 112 and the power lines 111 are selected according to different specific products and accessories.

In an optional embodiment, the welding plate surface 110 has three bonding pads 120, and two power connecting parts 210 and the one signal connecting part 220 are respectively welded on the three bonding pads 120; and three bonding pads 120 are respectively electrically connected with two power lines 111 and one signal line 112.

Specifically, after being packaged, the patch lamp bead 100 is welded on the in-line LED bracket 200 by using the bonding pads 120, so that the power connecting parts 210 are connected with the power lines 111, and the signal connecting part 220 is connected with the signal line 112.

In an optional embodiment, the in-line type point control lamp further comprises an injection molded part 300; and the patch lamp bead 100 is provided in the injection molded part 300, and the power connecting parts 210 extend into the injection molded part 300 and are connected to the power lines 111, and the signal connecting part 220 passes through the injection molded part 300 and is connected to the signal line 112.

Specifically, after the patch lamp bead 100 and the in-line LED bracket 200 are welded, an injection molded part 300 is formed outside the patch lamp bead 100, and the patch lamp bead 100 is wrapped by using the injection molded part 300 to form a point control lamp.

The lamp string structure provided in this embodiment includes the in-line type point control light.

Since the technical effect of the lamp string structure provided in this embodiment is the same as the technical effect of the in-line type point control lamp provided by the above-mentioned embodiments, it will not be repeated here.

Finally, it should be noted that: the above embodiments are only used to illustrate the technical solution of the present disclosure, not to limit it; although the present disclosure has been described in detail with reference to the above-mentioned embodiments, those ordinarily skilled in the art should understand that they can still modify the technical solution recorded in the above-mentioned embodiments, or equivalently replace some or all of the technical features; and these modifications or substitutions do not make the essence of the corresponding technical solutions out of the scope of the technical solutions of the embodiments of the present disclosure.

What is claimed is:

1. An in-line type point control lamp, comprising: a patch lamp bead and an in-line LED bracket;
    wherein the patch lamp bead has two power lines and one signal line, and the in-line LED bracket has two power connecting parts and one signal connecting part, the two power lines are respectively connected to the two power connecting parts, and the signal line is connected to the signal connecting part;
    the patch lamp bead has a welding plate surface, and the two power connecting parts and the one signal connecting part are all welded on the welding plate surface;
    the welding plate surface has three bonding pads, and the two power connecting parts and the one signal connecting part are respectively welded on the three bonding pads;
    the three bonding pads are respectively electrically connected to the two power lines and one signal line; and
    the welding plate surface is located on a backside of the patch lamp bead.

2. The in-line type point control lamp according to claim 1,
    wherein the in-line LED bracket comprises three welding parts; and
    the three welding parts are arranged side by side in parallel, and the three welding parts are all welded on the welding plate surface.

3. The in-line type point control lamp according to claim 2,
    wherein any two of the three welding parts are the power connecting parts, and one of the three welding parts is the signal connecting part.

4. The in-line type point control lamp according to claim 2,
    wherein the two power lines are respectively located on two sides of the signal line; and
    welding parts located on two sides are the two power connecting parts, and a welding part located in a middle of the two welding parts is the signal connecting part.

5. The in-line type point control lamp according to claim 1,
    wherein the in-line type point control lamp further comprises an injection molded part; and
    the patch lamp bead is provided in the injection molded part, and the power connecting parts extend into the injection molded part and are connected to the power lines, and the signal connecting part passes through the injection molded part and is connected to the signal line.

6. A lamp string structure, comprising the in-line type point control lamp according to claim 1.

\* \* \* \* \*